US011258355B2

(12) United States Patent
Cho et al.

(10) Patent No.: US 11,258,355 B2
(45) Date of Patent: Feb. 22, 2022

(54) DEVICE FOR POWER FACTOR CORRECTION

(71) Applicant: LG ELECTRONICS INC., Seoul (KR)

(72) Inventors: Seongmoo Cho, Seoul (KR); Kwangsoo Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 314 days.

(21) Appl. No.: 16/399,522

(22) Filed: Apr. 30, 2019

(65) Prior Publication Data

US 2020/0036283 A1   Jan. 30, 2020

(30) Foreign Application Priority Data

Jul. 27, 2018 (KR) .................. 10-2018-0087816

(51) Int. Cl.
| | |
|---|---|
| *H02M 1/42* | (2007.01) |
| *G05F 1/70* | (2006.01) |
| *H02P 23/26* | (2016.01) |
| *H02M 5/458* | (2006.01) |
| *H02M 1/32* | (2007.01) |

(52) U.S. Cl.
CPC .......... *H02M 1/4258* (2013.01); *G05F 1/70* (2013.01); *H02M 1/4233* (2013.01); *H02M 5/458* (2013.01); *H02P 23/26* (2016.02); *H02M 1/327* (2021.05); *H02P 2201/15* (2013.01)

(58) Field of Classification Search
CPC ....... H01L 23/34; H01L 23/48; H01L 23/481; H02M 1/4258; H02M 1/4233; H02M 1/327; H02P 23/26; G05F 1/70
See application file for complete search history.

(56) References Cited

U.S. PATENT DOCUMENTS

| | | | | |
|---|---|---|---|---|
| 6,462,976 B1 * | 10/2002 | Olejniczak | .............. | H01L 23/48 257/E23.01 |
| 2020/0124483 A1 * | 4/2020 | Hosotani | ................. | H01L 23/34 |

FOREIGN PATENT DOCUMENTS

| | | |
|---|---|---|
| JP | 2009-64904 A | 3/2009 |
| KR | 10-2016-0040978 A | 4/2016 |

(Continued)

*Primary Examiner* — Nguyen Tran

(74) *Attorney, Agent, or Firm* — Birch, Stewart, Kolasch & Birch, LLP

(57) ABSTRACT

A device for power factor correction can include a converter housing having an inner surface; a first converter substrate mounted on the inner surface of the converter housing; a second converter substrate mounted on another surface of first converter housing opposite to the inner surface; and a housing cover covering the first converter substrate and coupled to an upper surface of the converter housing, in which the second converter substrate includes a first surface having a first region including a source pad, and a second region including a drain pad spaced apart from the source pad, the source pad including a source pad extension portion extending into the second region; and a second surface including a heat dissipation pad for communicating heat from the source and drain pads to an outside of the device, in which the first region of the second converter substrate overlaps with the another surface of first converter housing, and the second region of the second converter substrate faces the housing cover without overlapping with the first converter substrate.

19 Claims, 8 Drawing Sheets

(56) References Cited

FOREIGN PATENT DOCUMENTS

| KR | 10-2016-0051513 A | 5/2016 |
| KR | 10-2016-0105266 A | 9/2016 |
| KR | 10-2017-0003112 A | 1/2017 |

* cited by examiner

DEVICE FOR POWER FACTOR CORRECTION

This application claims the priority benefit of Korean Patent Application No. 10-2018-0087816 filed on Jul. 27, 2018, the entire contents of which is incorporated herein by reference for all purposes as if fully set forth herein.

TECHNICAL FIELD

The present disclosure relates to a device for power factor correction, and more particularly to a device for power factor correction for improving heat dissipation through an efficient design of a heat dissipation substrate.

RELATED ART

Recent demands for energy reduction have become more severe due to climate change and eco-friendly policies. The existing home appliances/industrial products/electronic products and energy products are equipped with a power module for efficient energy conversion. In particular, there is a trend that the power module adopts an inverter/converter.

Accordingly, high integration/high power density of the power module is on the way, and hence new power module technologies are scrambling to be under development. The biggest technical barrier to such a development trend is the heat dissipation problem.

As one of efforts to solve the heat dissipation problem, various kinds of heat dissipation substrates (e.g., MPCB, DBC, AlN, etc.) each having different thermal conductivity have been manufactured. The design such as a stacking structure, a thickness, an area, and a component content of the substrate as well as the choice of a material of the substrate may be an important technical factor in improving the heat dissipation.

SUMMARY OF THE INVENTION

An object of the present disclosure is to address the above-described and other problems. Another object of the present disclosure is to provide a device for power factor correction for improving heat spreading through an efficient design of a heat dissipation substrate among several technical factors for improving the heat dissipation in the manufacturing of a power semiconductor power module.

In one aspect of the present disclosure, there is provided a device for power factor correction comprising a converter housing having an inner surface, a first converter substrate mounted on one surface of the inner surface, a second converter substrate mounted on the other surface of the inner surface, and a housing cover covering the first converter substrate and coupled to an upper surface of the converter housing, wherein the second converter substrate includes a first region on which a source pad is mounted, one surface on which a second region is disposed, wherein the source pad extended from the first region and a drain pad spaced apart from the source pad are mounted on the second region, and the other surface on which a heat dissipation pad for dissipating heat transferred to the source pad and the drain pad to the outside is mounted, wherein the first region is mounted on the other surface of the inner surface, and the second region faces the housing cover.

According to another aspect of the present disclosure, an air layer may be formed between the second region and the housing cover.

According to another aspect of the present disclosure, an area of the source pad may be formed to be larger than an area of the drain pad.

According to another aspect of the present disclosure, the converter housing may include a plurality of first internal connection terminals disposed on one side of the inner surface, a plurality of second internal connection terminals disposed on another side of the inner surface, a plurality of first external connection terminals disposed on one perimeter surface of the converter housing and electrically connected to the plurality of first internal connection terminals correspondingly to the plurality of first internal connection terminals, and a plurality of second external connection terminals disposed on another perimeter surface of the converter housing and electrically connected to the plurality of second internal connection terminals correspondingly to the plurality of second internal connection terminals, wherein the first converter substrate may include a plurality of first connection terminals disposed on one side of the first converter substrate and a plurality of second connection terminals disposed on another side of the first converter substrate, wherein the plurality of first connection terminals may be directly connected to the plurality of first internal connection terminals, wherein each of the source pad and the drain pad may be electrically connected to the second connection terminal and the second internal connection terminal through wires.

According to another aspect of the present disclosure, the plurality of heat dissipation pads may be mounted on the other surface of the second converter substrate.

Embodiments of the present disclosure can rapidly dissipate heat of a p-n junction generated in a transistor element by widely designing a source pad, and thus can efficiently reduce an overall temperature of a power module.

Embodiments of the present disclosure can dissipate heat of a p-n junction generated in a plurality of transistor elements to an air layer and a widely designed source pad at the same time by forming the air layer on the top of a second region of a second converter substrate on which the plurality of transistor elements is mounted and widely forming the source pad on a first region of the second converter substrate. Hence, embodiments of the present disclosure can more efficiently reduce an overall temperature of a power module by rapidly spreading the heat dissipation to the air layer and the source pad at the same time.

Further scope of applicability of the present disclosure will become apparent from the detailed description given hereinafter. However, it should be understood that the detailed description and specific examples, while indicating preferred embodiments of the disclosure, are given by illustration only, since various changes and modifications within the spirit and scope of the disclosure will become apparent to those skilled in the art from this detailed description.

DETAILED DESCRIPTION OF THE EMBODIMENTS

Reference will now be made in detail to embodiments of the disclosure, examples of which are illustrated in the accompanying drawings. Wherever possible, the same reference numbers will be used throughout the drawings to refer to the same or like parts.

In general, a suffix such as "module" and "unit" may be used to refer to elements or components. Use of such a suffix herein is merely intended to facilitate description of the specification, and the suffix itself is not intended to give any special meaning or function. It will be noted that a detailed description of known arts will be omitted if it is determined that the detailed description of the known arts can obscure the embodiments of the disclosure. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

The terms including an ordinal number such as first, second, etc. may be used to describe various components, but the components are not limited by such terms. The terms are used only for the purpose of distinguishing one component from other components.

When an arbitrary component is described as "being connected to" or "being coupled to" another component, this should be understood to mean that still another component(s) may exist between them, although the arbitrary component may be directly connected to or directly coupled to another component. In contrast, when an arbitrary component is described as "being directly connected to" or "being directly coupled to" another component, this should be understood to mean that no component exists between them.

A singular expression can include a plural expression as long as it does not have an apparently different meaning in context.

In the present application, the terms "include" and "have" should be understood to be intended to designate that illustrated features, numbers, steps, operations, components, parts or combinations thereof are present and not to preclude the existence of one or more different features, numbers, steps, operations, components, parts or combinations thereof, or the possibility of the addition thereof.

In the following description, embodiments of the disclosure are described using an organic light emitting diode (OLED) display panel as an example of a display panel, but are not limited thereto. Other display panels may be used.

For example, a plasma display panel (PDP), a field emission display (FED) panel, and a liquid crystal display (LCD) panel may be used.

Figure 1:
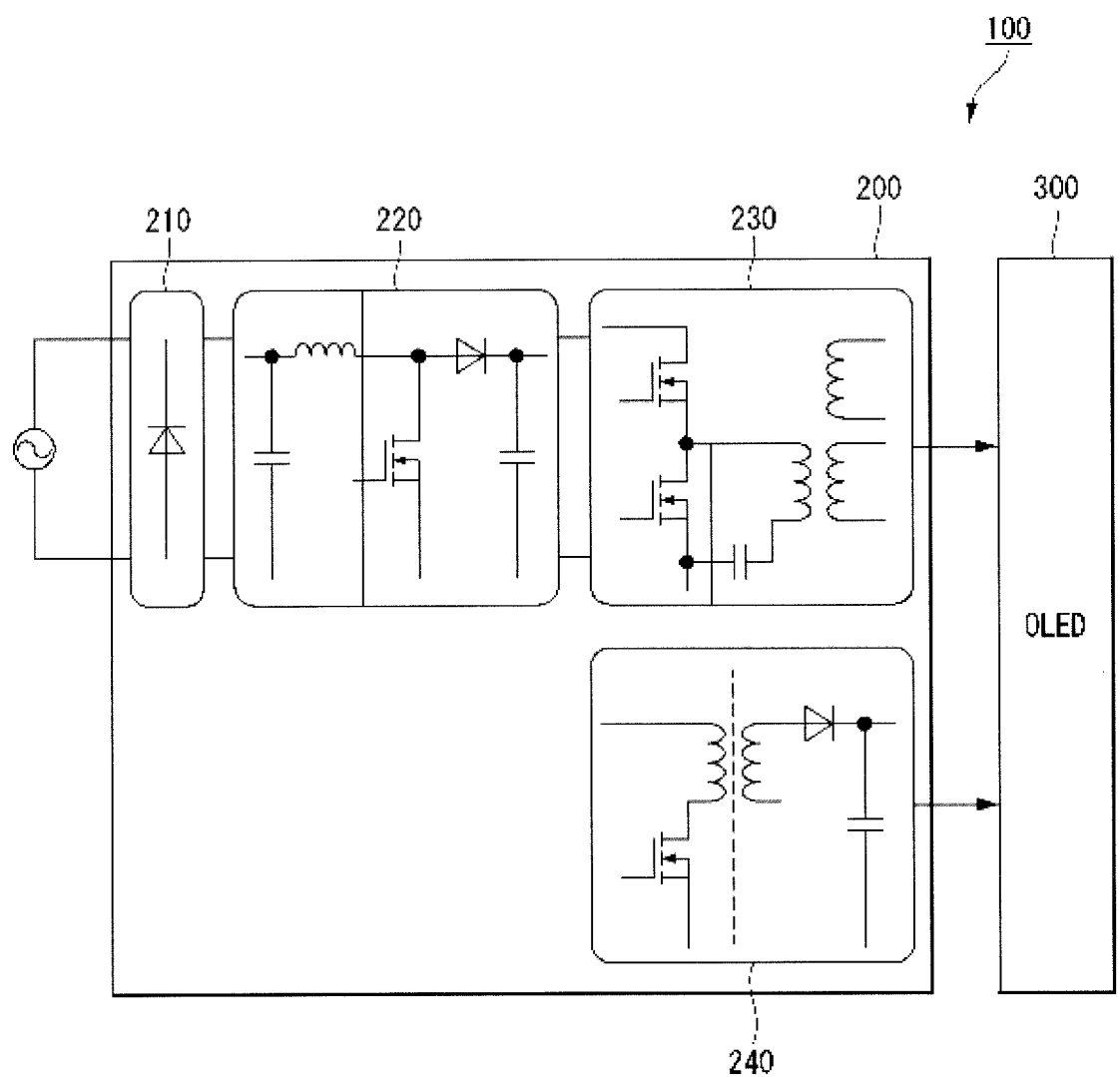
FIG. 1 illustrates an example of a display device according to an embodiment of the disclosure.

Referring to FIG. 1, a display device 100 may include a display driver 200 and a display module 300.

The display driver 200 may include a rectifying unit 210, a power factor correction (PFC) converter 220, a DC-DC converter 230, and so on.

The rectifying unit 210 may rectify an AC signal supplied from a line input terminal connected to an input terminal of the display driver 200. The rectifying unit 210 may include a plurality of diode elements D. For example, the rectifying unit 210 may include a diode bridge circuit. A rectified signal output by the rectifying unit 210 may be transmitted to the PFC converter 220.

The PFC converter 220 may convert a DC signal by correcting a power factor of the rectified signal supplied from the rectifying unit 210. The PFC converter 220 may include at least one switching element. For example, the switching element may include a transistor element TR and a diode element D. The transistor element TR may include a Si-MOSFET or a SJ-MOSFET. In addition, the diode element D may include a SiC diode.

An input impedance of the display driver 200 may be determined by at least one of a switching frequency and a duty ratio of the switching element included in the PFC converter 220.

The DC-DC converters 230 and 240 may buck the DC signal supplied from the PFC converter 220. The DC-DC converters 230 and 240 may buck the supplied DC signal to a level suitable for driving the display module 300.

Further, the DC-DC converters 230 and 240 may be provided in plural. One DC-DC converter 240 of the plurality of DC-DC converters 230 and 240 may operate when the display module 300 is in a standby state, and the remaining DC-DC converter 230 may operate when the display module 300 is in a driving state.

Also, the display driver 200 may include a controller. The controller may detect a driving current flowing in the display module 300 and control the PFC converter 220.

The display module 300 may include a display panel and so on. The display panel may be an organic light emitting diode (OLED) display panel. An active matrix OLED display panel includes a plurality of OLEDs capable of emitting light by themselves and has many advantages, such as fast response time, high emission efficiency, high luminance, wide viewing angle, and the like.

An OLED serving as a self-emitting element may include an anode electrode, a cathode electrode, and an organic compound layer between the anode electrode and the cathode electrode. The organic compound layer may include a hole injection layer HIL, a hole transport layer HTL, an emission layer EML, an electron transport layer ETL, and an electron injection layer EIL. When a driving voltage is applied to the anode electrode and the cathode electrode, holes passing through the hole transport layer HTL and electrons passing through the electron transport layer ETL move to the emission layer EML and form excitons. As a result, the emission layer EML can generate visible light.

Hence, the OLED display does not require a separate light source and can reduce volume and weight of the display device 100. Further, because a response time of the OLED display is more than 1,000 times faster than a response time of a liquid crystal display, the OLED display may not cause image retention when displaying an image.

In the present disclosure, the turns such as 'upper part', 'upper surface', 'lower part', 'lower surface', and 'side surface' are based on the drawings and may actually vary depending on a direction in which the PFC converter 220 is disposed. The main components of the PFC converter 220 will be described in more detail below.

Figure 2:
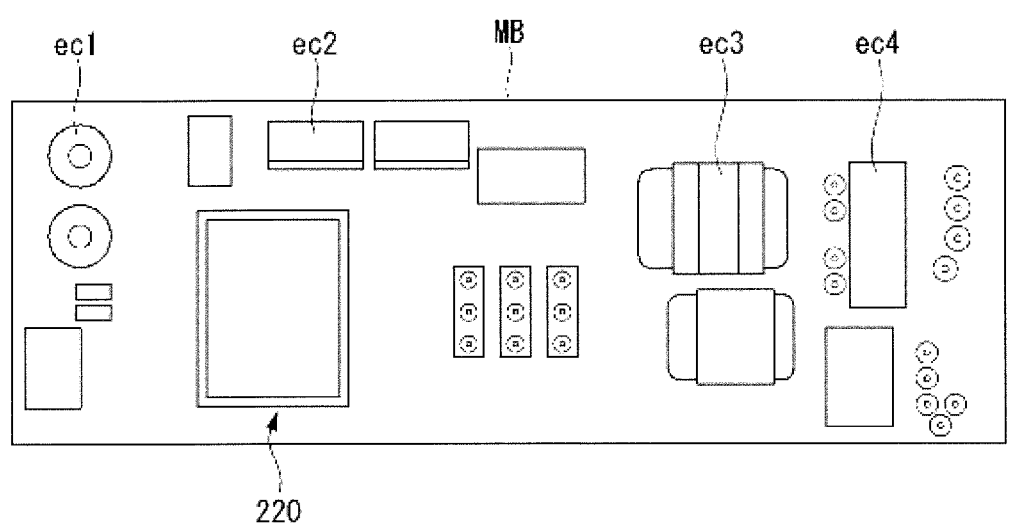
FIG. 2 illustrates that a rectifying unit, a power factor correction (PFC) converter, and a DC-DC converter are mounted on a main board in accordance with an embodiment of the disclosure.

Referring to FIG. 2, the rectifying unit 210, the PFC converter 220, and the DC-DC converter 230 illustrated in FIG. 1 may be mounted on a main board MB.

Each of the rectifying unit 210, the PFC converter 220, and the DC-DC converter 230 may be composed of a plurality of electronic components ec1 to ec4. The plurality of electronic components ec1 to ec4 may be disposed on the main board MB to be spaced apart from each other and may be electrically connected to each other. For example, the plurality of electronic components ec1 to ec4 may include a diode element D, a transistor element TR, a capacitor element C, an inductor element L, a semiconductor element IC, and so on.

At least one of the rectifying unit 210, the PFC converter 220, and the DC-DC converter 230 may have high integration/high power density. For example, the PFC converter 220 may be formed or manufactured as one power module capable of performing high integration/high power density on a plurality of transistor elements TR, a plurality of diode elements D, etc. The PFC converter 220 may be referred to as a power module or a PFC module.

Figure 3:
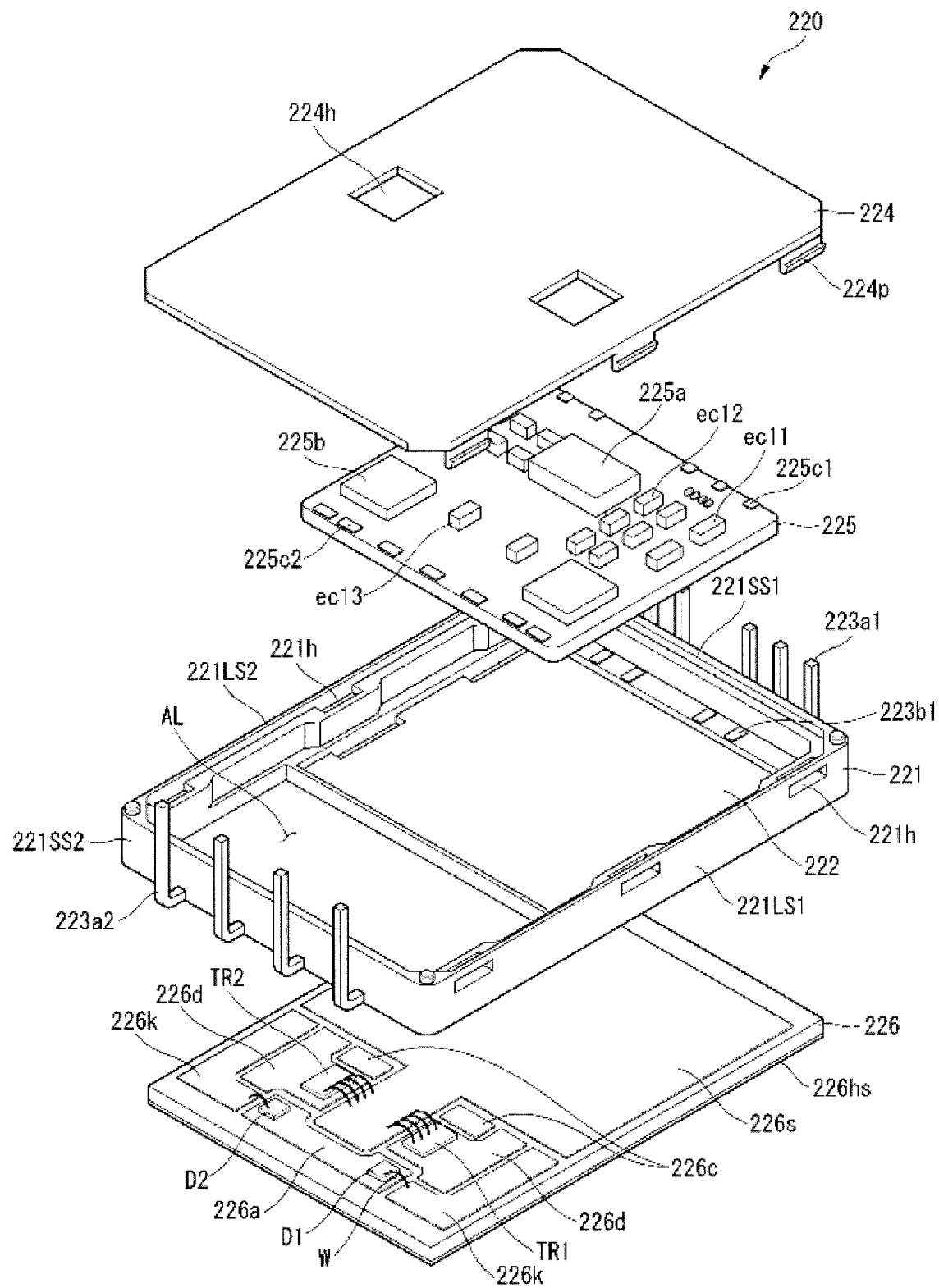
FIG. 3 illustrates an exploded view of a PFC converter according to an embodiment of the disclosure.

Referring to FIG. 3, the PFC converter 220 may include a first converter substrate 225, a converter housing 221, a housing cover 224, and a second converter substrate 226.

The first converter substrate 225 may include a plurality of drivers 225a and 225b, a plurality of electronic components ec11 to ec13, and a plurality of connection terminals 225c1 and 225c2 on one surface of the first converter substrate 225. That is, the plurality of drivers 225a and 225b or the plurality of electronic components ec11 to ec13 may be mounted on the first converter substrate 225. The plurality of drivers 225a and 225b may include a gate driver.

The plurality of connection terminals 225c1 and 225c2 may be respectively disposed on one side and the other side of the upper surface of the first converter substrate 225. For example, the plurality of connection terminals 225c1 and 225c2 may include a first connection terminal 225c1 and a second connection terminal 225c2. The plurality of first connection terminals 225c1 may be disposed along one side of the upper surface of the first converter substrate 225 while maintaining a constant distance therebetween. The plurality of second connection terminals 225c2 may be disposed along the other side of the upper surface of the first converter substrate 225 while maintaining a constant distance therebetween.

The plurality of drivers 225a and 225b or the plurality of electronic components ec11 to ec13 may be disposed between one side of the upper surface of the first converter substrate 225 and the other side of the upper surface of the first converter substrate 225. The plurality of drivers 225a and 225b or the plurality of electronic components ec11 to ec13 may be disposed in a central area of the first converter substrate 225.

The converter housing 221 may be formed in a shape in which an upper surface and a lower surface are opened. The converter housing 221 may be provided with an inner space between the opened upper surface and the opened lower surface, and perimeter surfaces 221LS1, 221LS2, 221SS1, and 221SS2 may be disposed along the perimeter of the inner space. The perimeter surfaces 221LS1, 221LS2, 221SS1, and 221SS2 may have a predetermined width and a predetermined thickness. The perimeter surfaces 221LS1, 221LS2, 221SS1, and 221SS2 may include a first perimeter surface 221LS1 extended in the longitudinal direction, a second perimeter surface 221LS2 that is extended in the longitudinal direction and is spaced apart from the first perimeter surface 221LS1, a third perimeter surface 221SS1 disposed between the first perimeter surface 221LS1 and the second perimeter surface 221LS2, and a fourth perimeter surface 221SS2 that is disposed between the first perimeter surface 221LS1 and the second perimeter surface 221LS2 and is spaced apart from the third perimeter surface 221SS1.

The converter housing 221 may include an inner surface 222. The inner surface 222 may be disposed in the inner space. The first converter substrate 225 may be embedded in the inner space. The first converter substrate 225 may be disposed or mounted on one surface of the inner surface 222.

The converter housing 221 may include a plurality of internal connection terminals 223b1 and 223b2. The plurality of internal connection terminals 223b1 and 223b2 may include first internal connection terminals 223b1 and second internal connection terminals 223b2. The plurality of first internal connection terminals 223b1 may be disposed on one side of the inner surface 222 or one side of the inner space. The plurality of first internal connection terminals 223b1 may be disposed along the one side while maintaining a constant distance therebetween. The plurality of second internal connection terminals 223b2 may be disposed on the other side of the inner surface 222 or the other side of the inner space. The plurality of second internal connection terminals 223b2 may be disposed along the other side while maintaining a constant distance therebetween.

The converter housing 221 may include a plurality of external connection terminals 223a1 and 223a2. The plurality of external connection terminals 223a1 and 223a2 may protrude in a direction in which the first converter substrate 225 is mounted on the converter housing 221. The plurality of external connection terminals 223a1 and 223a2 may be respectively disposed on one side and the other side of the converter housing 221. The plurality of external connection terminals 223a1 and 223a2 may include first external connection terminals 223a1 and second external connection terminals 223a2. The plurality of first external connection terminals 223a1 may be disposed on the third perimeter surface 221SS1 positioned on one side of the converter housing 221. The plurality of first external connection terminals 223a1 may be disposed along the third perimeter surface 221SS1 while maintaining a predetermined distance therebetween. The plurality of second external connection terminals 223a2 may be disposed on the fourth perimeter surface 221SS2 positioned on the other side of the converter housing 221. The plurality of second external connection terminals 223a2 may be disposed along the fourth perimeter surface 221SS2 while maintaining a constant distance therebetween.

The plurality of first external connection terminals 223a1 may be electrically connected to the plurality of first internal connection terminals 223b1.

The converter housing 221 may include a mounting hole 221h. The mounting hole 221h may be provided in plural. The mounting holes 221h may be disposed in the inner space and may be spaced apart at constant intervals along the first perimeter surface 221LS1 and the second perimeter surface 221LS2. The mounting holes 221h may be formed to pass through the first perimeter surface 221LS1 and the second perimeter surface 221LS2.

The housing cover 224 may be mounted on the upper surface of the converter housing 221. The housing cover 224 may be formed in a flat plate shape that can cover the upper surface of the converter housing 221. The housing cover 224 may include a cover hole 224h and a cover mounting member 224p.

The cover hole 224h may penetrate the housing cover 224. The cover hole 224h may be disposed around the center area of the housing cover 224. The number of cover holes 224h may be at least one.

The cover mounting member 224p may be disposed on both sides of the housing cover 224. The cover mounting member 224p may be provided in plural. The plurality of cover mounting members 224p may be disposed at constant intervals along both sides of the housing cover 224.

Both sides of the housing cover 224 may be sides corresponding to the first perimeter surface 221LS1 and the second perimeter surface 221LS2 on which the first external connection terminals 223a1 and the second external connection terminals 223a2 are not disposed. The cover mounting members 224p may protrude in a direction opposite to a direction in which the plurality of external connection terminals 223a1 and 223a2 protrude.

The cover mounting member 224p may be inserted into the mounting holes 221h disposed on the first perimeter surface 221LS1 and the second perimeter surface 221LS2 of the converter housing 221.

The second converter substrate 226 may be disposed on the lower surface of the converter housing 221. The second converter substrate 226 may be mounted on the other surface of the inner surface 222.

The second converter substrate 226 may mount a plurality of element pads 226s, 226g, 226d, 226k, and 226a, a plurality of switching elements TR1, TR2, D1, and D2, and a heat dissipation pad 226hs.

The plurality of element pads 226s, 226g, 226d, 226k, and 226a may be spaced apart from each other on one surface of the second converter substrate 226. For example, the plurality of element pads 226s, 226g, 226d, 226k, and 226a may include a source pad 226s, a drain pad 226d, a gate pad 226g, a cathode pad 226k, and an anode pad 226a. The plurality of element pads 226s, 226g, 226d, 226k, and 226a may have different sizes.

The plurality of switching elements TR1, TR2, DE and D2 may be disposed on one surface of the second converter substrate 226 and may be electrically connected to the plurality of element pads 226s, 226g, 226d, 226k, and 226a. For example, the plurality of switching elements TR1, TR2, D1, and D2 may include transistor elements TR1 and TR2 and diode elements D1 and D2. For example, the transistor elements TR1 and TR2 may include a Si-MOSFET or a SJ-MOSFET. The diode elements D1 and D2 may include SiC diodes.

The heat dissipation pad 226hs may be disposed on the other surface of the second converter substrate 226. The heat dissipation pad 226hs may be referred to as a heat dissipation plate.

Figure 4:
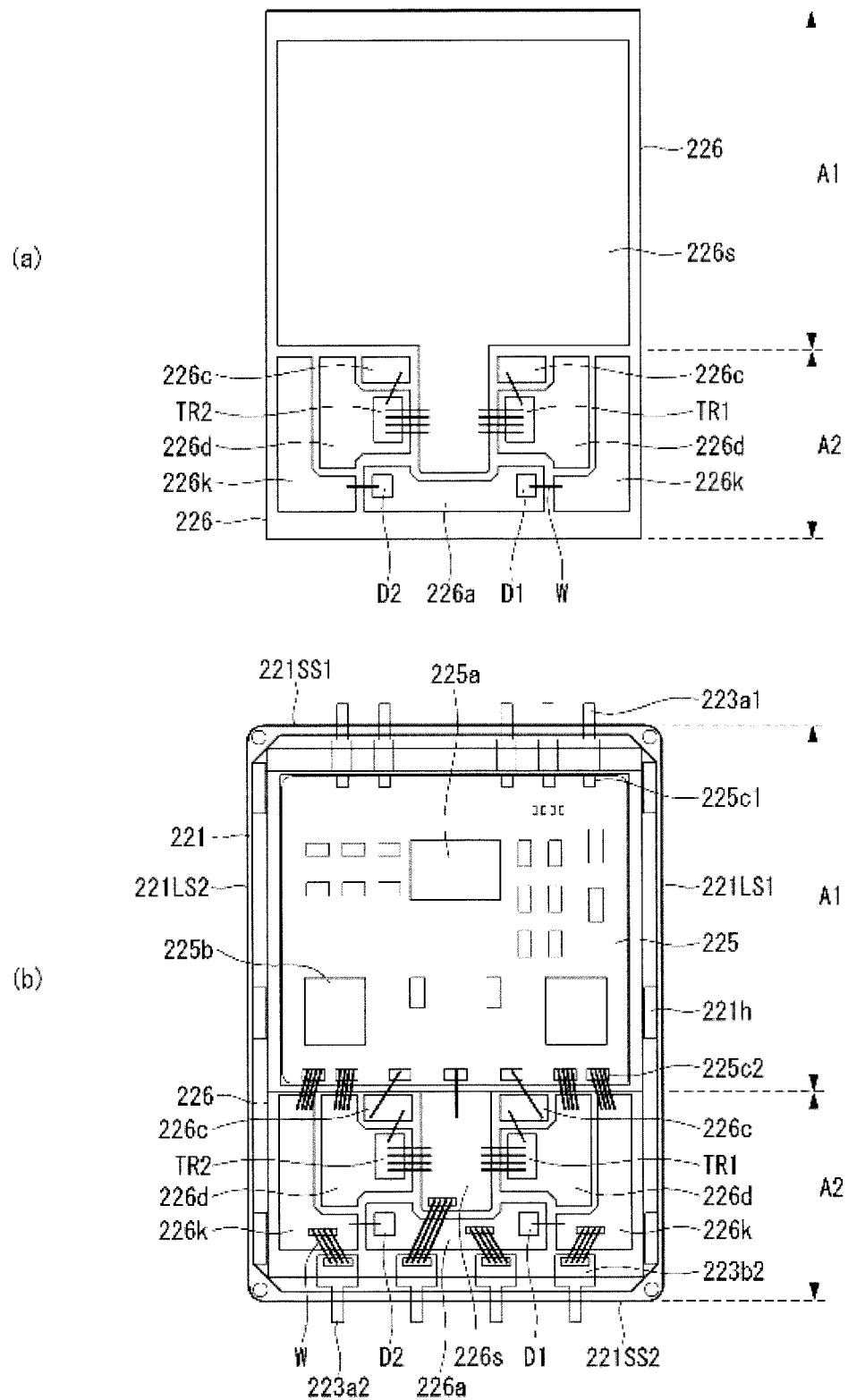
FIG. 4 illustrates the inside of a PFC converter according to an embodiment of the disclosure.

Referring to (a) of FIG. 4, the plurality of element pads 226s and 226d may be mounted on the second converter substrate 226.

The second converter substrate 226 may be divided into a first region A1 and a second region A2.

The first region A1 may be an area disposed on one side of the second converter substrate 226. The second region A2 may be an area disposed on the other side of the second converter substrate 226. The second region A2 may also be a remaining area excluding the first region A1 from the second converter substrate 226.

The source pad 226s, the drain pad 226d, the gate pad 226g, the cathode pad 226k, and the anode pad 226a may have different sizes.

The source pad 226s may be disposed in the first region A1.

The source pad 226s, the drain pad 226d, the gate pad 226g, the cathode pad 226k, and the anode pad 226a may be disposed in the second region A2. The drain pad 226d, the gate pad 226g, the cathode pad 226k, and the anode pad 226a may be disposed in only the second region A2.

The source pad 226s may have a wide area over the first region A1 and the second region A2.

The drain pad 226d, the gate pad 226g, the cathode pad 226k, and the anode pad 226a may be spaced apart from each other in the second region A2 and may have a small area.

The area of the source pad 226s may be more than two times and less than 50 times the area of the drain pad 226d. When the area of the source pad 226s is less than two times the area of the drain pad 226d, a heat dissipation function for discharging heat may be remarkably lowered. Further, considering the size of the second converter substrate 226 and the size of the converter housing 221, the source pad 226s cannot have an area that is more than 50 times the area of the drain pad 226d.

The transistor elements TR1 and TR2 may be mounted in the second region A2 and may be electrically connected to the drain pad 226d, the source pad 226s, and the gate pad 226g through wires. The diode elements D1 and D2 may be mounted in the second region A2 and may be electrically connected to the cathode pad 226k and the anode pad 226a through wires.

As described above, the present disclosure can maximize the heat dissipation effect by minimizing the area of the drain pad 226d and designing the area of the source pad 226s as wide as possible. In other words, the present disclosure can rapidly transfer, to the source pad 226s, heat of a p-n junction generated in the transistor elements TR1 and TR2 which are being driven, through wires by designing the area of the source pad 226s as wide as possible, and thus can improve the spreading of heat dissipation. Hence, the present disclosure can rapidly reduce an overall temperature of the power module by improving the spreading of heat dissipation.

Figure 5:
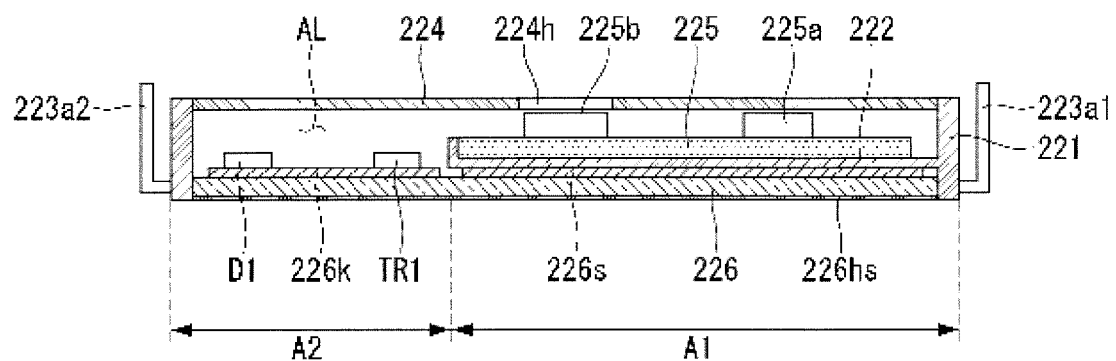
FIG. 5 illustrates that a PFC converter is cut along a longitudinal direction in accordance with an embodiment of the disclosure.

Referring to (a) of FIG. 4 and FIG. 5, the second converter substrate 226 may be formed to be larger than the first converter substrate 225 and the inner surface 222 of the converter housing 221. The first converter substrate 225 may be formed to be substantially equal to or smaller than the inner surface 222 of the converter housing 221.

The first converter substrate 225 may be mounted inside the top of the inner surface 222 of the converter housing 221. The first converter substrate 225 may be disposed to overlap the inner surface 222 of the converter housing 221.

The second converter substrate 226 may be partially mounted on the bottom of the inner surface 222 of the converter housing 221. The first region A1 of the second converter substrate 226 may be mounted on the bottom of the inner surface 222 of the converter housing 221. The second region A2 of the second converter substrate 226 may not be mounted on the bottom of the inner surface 222 of the converter housing 221. The first region A1 of the second converter substrate 226 may overlap the inner surface 222 of the converter housing 221, but the second region A2 of the second converter substrate 226 may not overlap the inner surface 222 of the converter housing 221.

That is, the inner surface 222 of the converter housing 221, the first converter substrate 225, and the housing cover 224 may be stacked on the top of the first region A1 of the second converter substrate 226. The housing cover 224 may be spaced apart from the top of the second region A2 of the second converter substrate 226. The second region A2 of the second converter substrate 226 may face the housing cover 224. An air layer AL may be disposed or foil led between the top of the second region A2 of the second converter substrate 226 and the housing cover 224 that are spaced apart from each other.

The PFC converter 220 according to the present disclosure can dissipate heat of the p-n junction generated in the plurality of transistor elements TR1 and TR2 to both the air layer AL and the widely designed source pad 226s at the same time by forming the air layer AL on the top of the second region A2 of the second converter substrate 226 on which the plurality of transistor elements TR1 and TR2 are mounted and widely forming the source pad 226s on the first region A1 of the second converter substrate 226. Hence, the PFC converter 220 according to the present disclosure can more efficiently reduce an overall temperature of the power module by rapidly spreading the heat dissipation to the air layer AL and the source pad 226s at the same time.

The first converter substrate 225 and the second converter substrate 226 may be electrically connected through wires. For example, the wires may be A1 wires.

The plurality of first and second internal connection terminals 223b1 and 223b2 may be electrically and directly connected or connected to the plurality of first and second external connection terminals 223a1 and 223a2 in a one-to-one correspondence.

The plurality of first connection terminals 225c1 may be electrically and directly connected or connected to the plurality of first internal connection terminals 223b1 in a one-to-one correspondence. Thus, the plurality of first connection terminals 225c1 may be electrically connected or connected to the plurality of first external connection terminals 223a1 in a one-to-one correspondence. The plurality of second connection terminals 225c2 may be electrically connected or connected to the source pad 226s, the drain pad 226d, the gate pad 226g, and the cathode pad 226k through A1 wires.

The plurality of second internal connection terminals 223b1 may be electrically connected or connected to the source pad 226s, the cathode pad 226k, and the anode pad 226a through A1 wires. The source pad 226s, the cathode pad 226k, and the anode pad 226a may be electrically connected or connected to the plurality of second external connection terminals 223a1.

The transistor elements TR1 and TR2 may be mounted on the drain pad 226d. Drain terminals D of the transistor elements TR1 and TR2 may be directly connected or connected to the drain pad 226d, source terminals S of the transistor elements TR1 and TR2 may be connected to the source pad 226s through A1 wires, and gate terminals G of the transistor elements TR1 and TR2 may be connected to the gate pad 226g through A1 wires.

The diode elements D1 and D2 may be mounted on the anode pad 226a. Anode terminals A of the diode elements D1 and D2 may be directly connected or connected to the anode pad 226a, and cathode terminals K of the diode elements D1 and D2 may be connected to the cathode pad 226k through A1 wires.

Figure 6:
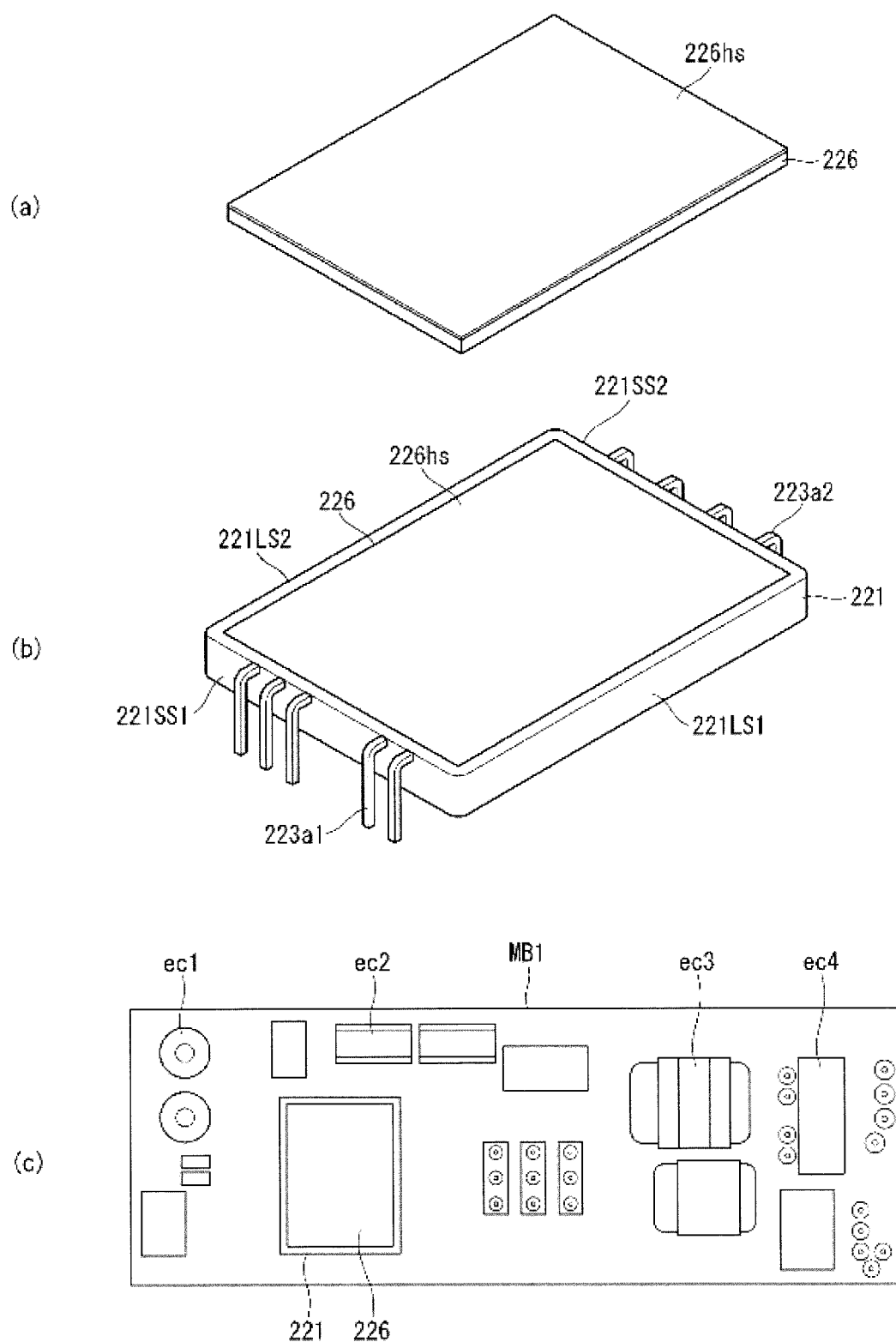
FIG. 6 illustrates an example of a heat dissipation pad mounted on a PFC converter in accordance with an embodiment of the disclosure.

Referring to (a) to (c) of FIG. 6, the heat dissipation pad 226hs may be disposed on the bottom of the second converter substrate 226. One heat dissipation pad 226hs may be provided. The heat dissipation pad 226hs may be referred to as a heat sink.

The PFC converter 220 may be formed of a power module or a PFC module. The PFC converter 220 may be mounted on a main board MB1. When one heat dissipation pad 226hs is mounted on the PFC converter 220, the main board MB1 can improve the degree of freedom of design. That is, the main board MB1 can prevent a malfunction of the electronic components ec1 to ec4 due to heat generated in the PFC converter 220 by sufficiently securing a separation distance between the plurality of electronic components ec1 to ec4 and the PFC converter 220 which generates a lot of heat during a drive.

Figure 7:
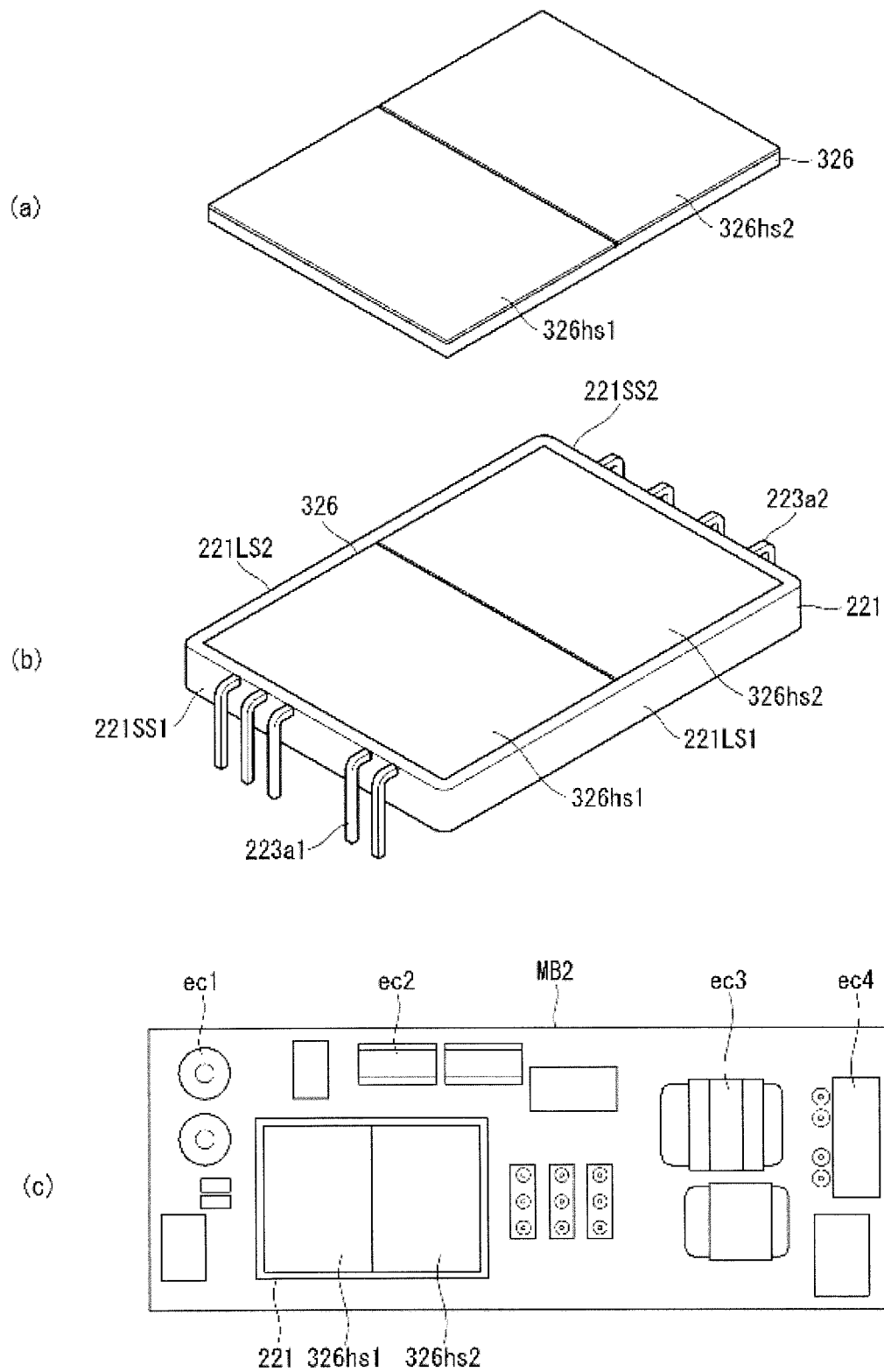
FIG. 7 illustrates another example of a heat dissipation pad mounted on a PFC converter in accordance with an embodiment of the disclosure.

Referring to (a) to (c) of FIG. 7, heat dissipation pads 326hs1 and 326hs2 may be disposed on the bottom of the second converter board 326. The plurality of heat dissipation pads 326hs1 and 326hs2 may be formed.

When the two heat dissipation pads 326hs1 and 326hs2 are mounted in parallel on the PFC converter 220, the different heat dissipation pads 326hs1 and 326hs2 may be disposed depending on a mounting position. For example, the first heat dissipation pad 326hs1 may be mounted on a portion of the PFC converter 220 where much heat is generated, and the second heat dissipation pad 326hs2 may be mounted on another portion of the PFC converter 220 where heat is less generated.

The first heat dissipation pad 326hs1 and the second heat dissipation pad 326hs2 may have different coefficients of heat conduction or different thermal conductivity. For example, the first heat dissipation pad 326hs1 may include silver, copper, gold and so on, each of which has good coefficient of heat conduction or thermal conductivity, and the second heat dissipation pad 326hs2 may include aluminum, magnesium, iron and so on, each of which has low coefficient of heat conduction or thermal conductivity but is cheap.

As described above, the present disclosure can reduce the manufacturing cost while improving the heat dissipation effect by differing the coefficients of heat conduction or the thermal conductivity of the plurality of heat dissipation pads 326hs1 and 326hs2 depending on the position of the PFC converter 220 on which the heat dissipation pads 326hs1 and 326hs2 are mounted.

FIG. 7 illustrates that the coefficients of heat conduction or the thermal conductivity of the first heat dissipation pad 326hs1 and the second heat dissipation pad 326hs2 are different from each other, but the present disclosure is not limited thereto. For example, the heat dissipation effect can be further improved by differing stacking structures, thicknesses, areas, component contents, etc. of the first heat dissipation pad 326hs1 and the second heat dissipation pad 326hs2.

Figure 8:
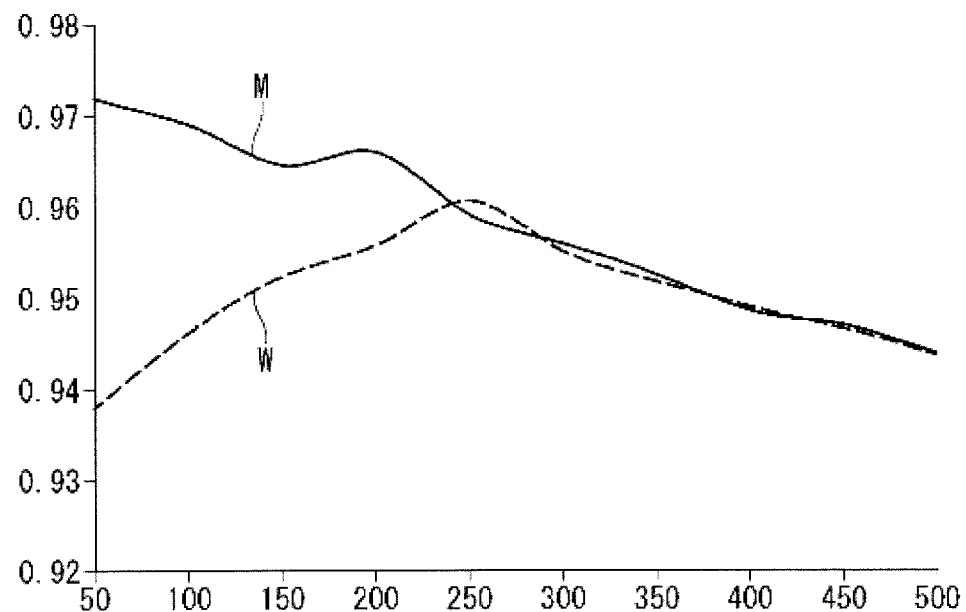
FIGS. 8 and 9 are graphs illustrating electrical characteristics of a PFC converter according to an embodiment of the disclosure.

FIG. 8 illustrates an improvement of an efficiency at a low load among electrical characteristics of the PFC converter 220 (see FIG. 3), in which the source pad 226s (see FIG. 3) is extended, and a related art PFC module through a comparison. Further, FIG. 9 illustrates an improvement of a power factor of voltage and current among electrical characteristics of the PFC converter 220 (see FIG. 3), in which the source pad 226s (see FIG. 3) is extended, and the related art PFC module through a comparison.

Figure 9:
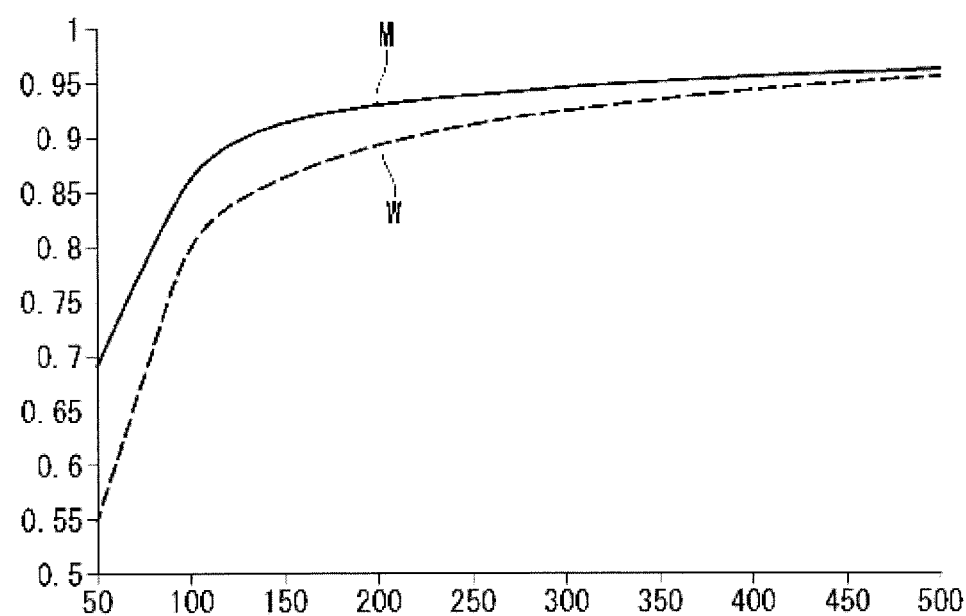

In FIGS. 8 and 9, "W" denotes a measurement value of the PFC converter 220 (see FIG. 3) according to the present disclosure, in which the source pad 226s (see FIG. 3) is extended, and "M" denotes a measurement value of the related art PFC module.

The PFC converter 220 (see FIG. 3) according to the present disclosure can reduce a gate resistance by further extending the source pad 226s (see FIG. 3) compared to the related art PFC module, and can improve the efficiency at the low load by reducing a turn-off loss through a reduction in parasitic components.

That is, the present disclosure can reduce a conduction loss or a switching loss by increasing the size of the source pad in which a high voltage and a high current are applied to a drain and escape to the ground. Further, the present disclosure can improve a power factor of voltage and current.

Some embodiments or other embodiments of the disclosure described above are not exclusive or distinct from each other. Some embodiments or other embodiments of the disclosure described above can be used together or combined in configuration or function.

The above detailed description is merely an example and is not to be considered as limiting the present disclosure. The scope of the present disclosure should be determined by rational interpretation of the appended claims, and all changes within the equivalent range of the present disclosure are included in the scope of the present disclosure.

The invention claimed is:

1. A device for power factor correction, the device comprising:
    a converter housing having an inner surface;
    a first converter substrate mounted on the inner surface of the converter housing;
    a second converter substrate mounted on another surface of the converter housing opposite to the inner surface of the converter housing; and
    a housing cover covering the first converter substrate and coupled to an upper surface of the converter housing,
    wherein the second converter substrate includes:
        a first surface having a first region including a source pad, and a second region including a drain pad spaced apart from the source pad, the source pad including a source pad extension portion extending into the second region; and
        a second surface including a heat dissipation pad for communicating heat from the source and drain pads to an outside of the device,
    wherein the first region of the second converter substrate overlaps with the another surface of the converter housing,
    wherein the second region of the second converter substrate faces the housing cover without overlapping with the first converter substrate, and
    wherein an area of the source pad is greater than an area of the drain pad.

2. The device for power factor correction of claim 1, further comprising:
    a power factor correction (PFC) converter having a plurality of electrical components,
    wherein the plurality of electrical components are disposed across the first and second converter substrates, and
    wherein an output of the power factor correction (PFC) converter is connected to a DC-DC converter.

3. The device for power factor correction of claim 1, further comprising:
    an air layer between the second region of the second converter substrate and the housing cover.

4. The device for power factor correction of claim 3, wherein the air layer is between the housing cover and the drain pad and the source pad extension portion.

5. The device for power factor correction of claim 3, wherein the drain pad and the source pad extension portion are both disposed between the air layer and at least a portion of the heat dissipation pad.

6. The device for power factor correction of claim 1, wherein the area of the source pad is at least twice as large as the area of the drain pad, and the area of the source pad is less than 50 times as large as the area of the drain pad.

7. The device for power factor correction of claim 1, wherein an area of the converter housing is less than 50 times as large as the area of the drain pad.

8. The device for power factor correction of claim 1, wherein the converter housing includes:
    a plurality of first internal connection terminals disposed on one side of the inner surface of the converter housing;
    a plurality of second internal connection terminals disposed on another side of the inner surface of the converter housing;
    a plurality of first external connection terminals disposed on one perimeter surface of the converter housing and electrically connected to the plurality of first internal connection terminals, respectively; and
    a plurality of second external connection terminals disposed on another perimeter surface of the converter housing and electrically connected to the plurality of second internal connection terminals, respectively.

9. The device for power factor correction of claim 8, wherein the first converter substrate includes a plurality of first connection terminals disposed on one side of the first converter substrate and a plurality of second connection terminals disposed on another side of the first converter substrate.

10. The device for power factor correction of claim 9, wherein the plurality of first connection terminals are directly connected to the plurality of first internal connection terminals, respectively.

11. The device for power factor correction of claim 9, wherein each of the source pad and the drain pad is electrically connected to the plurality of second connection terminals and the plurality of second internal connection terminals through wires.

12. The device for power factor correction of claim 1, wherein the heat dissipation pad includes a plurality of heat dissipation pads mounted on the second surface of the second converter substrate.

13. The device for power factor correction of claim 1, further comprising:
    at least one transistor element disposed in the second region of the second converter substrate, the at least one transistor element being electrically connected between the source pad and the drain pad.

14. A device for power factor correction, the device comprising:
    a first converter substrate;
    a second converter substrate;
    a power factor correction (PFC) converter including a plurality of electrical components disposed across the first and second converter substrates;
    a converter housing disposed between the first and second converter substrates; and
    a housing cover overlapping with both the first and second converter substrates,
    wherein the second converter substrate includes:
        a first surface having a first region including a source pad, and a second region including a drain pad spaced apart from the source pad; and a second surface including a heat dissipation pad for dissipating heat from the source and drain pads, wherein the first region of the second converter substrate overlaps with the first converter substrate, wherein the second region of the second converter substrate faces the housing cover without overlapping with the first converter substrate, and wherein an area of the source pad is greater than an area of the drain pad.

15. The device for power factor correction of claim 14, wherein the source pad includes a source pad extension portion extending into the second region.

16. The device for power factor correction of claim 14, further comprising:

an air layer between the second region of the second converter substrate and the housing cover.

17. The device for power factor correction of claim 16, wherein the air layer is between the housing cover and the drain pad and the source pad extension portion.

18. The device for power factor correction of claim 16, wherein the drain pad and the source pad extension portion are both disposed between the air layer and at least a portion of the heat dissipation pad.

19. A device for power factor correction, the device comprising:

a first converter substrate;

a second converter substrate;

a power factor correction (PFC) converter including a plurality of electrical components disposed across the first and second converter substrates; and a converter housing disposed between the first and second converter substrates, wherein the second converter substrate includes:

a first surface having a first region including a source pad, and a second region including a drain pad spaced apart from the source pad; and a second surface including a heat dissipation pad for dissipating heat from the source and drain pads, and wherein an area of the source pad is at least twice as large as an area of the drain pad.

\* \* \* \* \*